(12) United States Patent
Baba

(10) Patent No.: US 7,298,273 B2
(45) Date of Patent: Nov. 20, 2007

(54) RFID TAG

(75) Inventor: Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 11/142,356

(22) Filed: Jun. 2, 2005

(65) Prior Publication Data
US 2006/0214793 A1 Sep. 28, 2006

(30) Foreign Application Priority Data
Mar. 22, 2005 (JP) .............................. 2005-081398

(51) Int. Cl.
*G08B 13/14* (2006.01)
(52) U.S. Cl. .................................. 340/572.7; 340/572.1
(58) Field of Classification Search ............. 340/572.1, 340/572.4, 572.5, 572.7, 10.34, 10.42, 572.8; 343/700 MS, 793
See application file for complete search history.

(56) References Cited

U.S. PATENT DOCUMENTS

| | | | | |
|---|---|---|---|---|
| 5,407,669 | A * | 4/1995 | Lindstrom et al. | 424/78.04 |
| 5,446,447 | A * | 8/1995 | Carney et al. | 340/572.4 |
| 5,604,485 | A * | 2/1997 | Lauro et al. | 340/572.5 |
| 6,094,138 | A | 7/2000 | Eberhardt et al. | |
| 6,239,703 | B1 | 5/2001 | Friedman et al. | 340/572.7 |
| 6,265,977 | B1 | 7/2001 | Vega et al. | |
| 6,535,175 | B2 | 3/2003 | Brady et al. | 340/572.7 |
| 6,853,087 | B2 | 2/2005 | Neuhaus et al. | |
| 6,914,562 | B2 * | 7/2005 | Forster | 343/700 MS |
| 6,985,122 | B2 * | 1/2006 | Cohen | 343/793 |
| 7,158,033 | B2 * | 1/2007 | Forster | 340/572.1 |
| 2002/0003496 | A1 | 1/2002 | Brady et al. | |
| 2004/0201522 | A1 | 10/2004 | Forster | |

FOREIGN PATENT DOCUMENTS

| | | |
|---|---|---|
| WO | 02/099764 | 12/2002 |
| WO | 2005/083627 | 9/2005 |
| WO | 2006/011091 | 2/2006 |

OTHER PUBLICATIONS

U.S. Appl. No. 11/454,848, filed Jun. 19, 2006, Shunji Baba, Fujitsu Limited.
European Search Report dated Apr. 26, 2007.

* cited by examiner

*Primary Examiner*—Van T. Trieu
(74) *Attorney, Agent, or Firm*—Staas & Halsey LLP

(57) ABSTRACT

An RFID tag, including: a base; an antenna pattern that is provided on the base to form a communication antenna and has a tapered connection end portion which provides a connection terminal to the antenna; an electric conductor that is attached onto the connection end portion of the antenna pattern and is smaller than the connection end portion; and a circuit chip that is electrically connected to the antenna pattern via the electric conductor and performs radio communication by use of the antenna.

10 Claims, 6 Drawing Sheets

RFID TAG

BACKGROUND OF THE INVENTION

1. Field of the Invention

The present invention relates to an RFID (Radio Frequency Identification) tag that performs information exchange with external equipment in a noncontact manner. Incidentally, among those skilled in the art related to the technical field of the present application, the "RFID tag" used in the specification of the present application may sometimes be called an "inlay for RFID tag" by regarding the "RFID tag" as an internal component member (inlay) for "RFID tag." Or alternatively, in some cases, this "RFID tag" may be referred to as "a radio IC tag." Also, a noncontact type IC card is included in this "RFID tag."

2. Description of the Related Art

In recent years, there have been proposed various RFID tags that perform information exchange with external equipment represented by a reader/writer in a noncontact manner by use of radio waves (refer to U.S. Pat. No. 6,239,703B1, for example). As one kind of this RFID tag, there has been proposed an RFID tag in which an antenna pattern for radio communication and an IC chip are mounted on a base sheet made of plastics or paper. A conceived mode of using an RFID tag of this type is such that the RFID tag is stuck to an article and the like and performs the identification of the article by exchanging information on the article with external equipment.

In such an RFID tag, a circuit chip and an antenna pattern are electrically connected together by pinching a micro electric conductor called a bump between the circuit chip and an end portion of the antenna pattern. The circuit chip is fixed to the above-described base sheet and on this occasion, the area between the circuit chip and the end portion of the antenna pattern except the part occupied by the bump is filled with an adhesive. As a result, it follows that a micro capacitor is formed, with the circuit chip and the end portion of the antenna pattern serving as electrodes. The capacity of such a capacitor that is unnecessary in terms of design is called a parasitic capacity, and a parasitic capacity in an RFID tag has an adverse effect as described below.

There is a type of RFID tag that obtains operating power of an internal circuit chip from external equipment, and in this type of RFID tag the power from external equipment is supplied to the circuit chip via an antenna pattern. When at this time, a parasitic capacity exists between the mutually electrically connected circuit chip and end portion of the antenna pattern, the input of operating power from the antenna pattern to the circuit chip is interfered with. As a result, there is a possibility that troubles such as the deterioration of the communication distance of the RFID tag due to insufficient operating power might be caused.

Therefore, there have been proposed techniques which involve providing, on the antenna pattern side, an adjustment pattern capable of changing an impedance by working such as etching, and adjusting an impedance including the above-described parasitic capacity between the antenna pattern and the circuit chip by working this adjustment pattern (refer to U.S. Pat. No. 6,535,175B2, for example).

However, such adjustment work has the problem that productivity is lowered thereby.

Hence, measures against the above-described parasitic capacity in an RFID tag often involve predicting the parasitic capacity and providing, on the antenna pattern side, a pattern which generates an inductance which cancels out the parasitic capacity by a circuital resonance.

The above-described prediction of a parasitic capacity in an RFID tag is performed on the basis of the area of a portion in which the circuit chip and the end portion of the antenna pattern overlap each other, with the above-described bump pinched between the two, (an overlapping portion).

However, there are variations in the positional relationship between the above-described circuit chip and the antenna pattern during the manufacture of an RFID tag, and it is difficult to predict a parasitic capacity in a stable manner. Furthermore, even when a predicted parasitic capacity is determined beyond the limits of reason and an inductance is found on the basis of the parasitic capacity, in a case where an actual parasitic capacity should differ from the predicted parasitic capacity, it becomes impossible to ensure matching between the actual parasitic capacity and the impedance and the above-described resonance does not occur any more. As a result, the parasitic capacity is not canceled and it follows that the above-described problem of deterioration of the communication distance of the RFID tag or the like occurs.

SUMMARY OF THE INVENTION

The present invention has been made in view of the above circumstances and provides an RFID tag which can be manufactured with high productivity while avoiding the deterioration of communication distance.

An RFID tag of the present invention is provided with a base, an antenna pattern that is provided on the base to form a communication antenna and has a tapered connection end portion which provides a connection terminal to the antenna, an electric conductor that is attached onto the connection end portion of the antenna pattern and is smaller than the connection end portion, and a circuit chip that is electrically connected to the antenna pattern via the electric conductor and performs radio communication by use of the antenna.

In an RFID tag of the present invention, a form in which "the antenna pattern has an inductance generation portion that generates an inductance suited to a capacitance between the connection end portion and the circuit chip and prevents performance deterioration of the antenna due to the capacitance" is a typical form.

In an RFID tag of the present invention, the circuit chip overhangs the connection end part of the antenna pattern, with the electric conductor pinched. As a result, it follows that the circuit chip and the connection end portion of the antenna pattern overlap each other with a gap for the electric conductor. In the part of this portion where the two overlap each other (the overlapping portion) except the conductor, there is formed a capacitor which is unnecessary in terms of design, with the circuit chip and the connection end portion which are opposed each other serving as electrodes. The capacity of this capacitor (the parasitic capacity) is proportional to the area of the overlapping portion and inversely proportional to the gap between the circuit chip and the connection end portion of the antenna pattern in this overlapping portion.

Incidentally, in manufacturing an RFID tag of the present invention, it is a general practice to adopt a method by which the electric conductor is attached to the circuit chip and after that, the circuit chip is heated while the circuit chip is being pressed against the base to ensure that the electric conductor is attached to the connection end portion of the antenna pattern. When this method is adopted, the electric conductor, along with part of the connection end portion, sinks into the base.

In a case where the circuit chip is mounted in such a manner as to be shifted toward the leading end side of the connection end portion, the area of the overlapping portion becomes narrow and a decrease proportional to this narrowing of the are occurs in the parasitic capacity. In this case, the position where the electric conductor is attached to the connection end portion is shifted toward the leading end side of the connection end portion. And because the connection end portion is tapered and its strength decreases toward the leading end, the electric conductor sinks deep into the base, with the result that the gap between the circuit chip and the connection end portion of the antenna pattern in the overlapping portion becomes narrow and that an increase inversely proportional to this narrowing of the gap occurs in the parasitic capacity. As a result, the above-described decrease and increase cancel each other out and, therefore, it follows that a change scarcely occurs in the parasitic capacity even when the mounting position of the circuit chip is shifted toward the leading end side of the connection end portion.

On the other hand, in a case where the circuit chip is mounted in such a manner as to be shifted toward the base side of the connection end portion, contrary to the above-described case, the area of the overlapping portion widens and the gap between the circuit chip and the connection end portion of the antenna pattern in the overlapping portion widens. As a result, an increase proportional to the widening of the area of the overlapping portion and a decrease inversely proportional to the widening of the gap between the circuit chip and the connection end portion occur in the parasitic capacity and the two cancel each other out and, therefore, it follows that a change scarcely occurs in the parasitic capacity even when the mounting position of the circuit chip is shifted toward the base side of the connection end portion.

As described above, in an RFID tag of the present invention, the parasitic capacity is stable for manufacturing reasons and, therefore, the parasitic capacity can be predicted in a stable manner. As a result of this, it is possible to take, as a measure related to a parasitic capacity, a measure capable of obtaining high productivity without imposing burden on manufacturing, for example, providing an antenna pattern having an inductance generation portion which causes an inductance determined on the basis of a predicted parasitic capacity to be generated. In other words, according to the present invention, it is possible to obtain an RFID tag capable of being manufactured with high productivity while avoiding the deterioration of communication distance.

As described above, according to the present invention, it is possible to provide an RFID tag capable of being manufactured with high productivity while avoiding the deterioration of communication distance.

BRIEF DESCRIPTION OF THE DRAWINGS

Preferred embodiments of the present invention will be described in detail based on the following figures, wherein.

DETAILED DESCRIPTION OF THE INVENTION

Figure 1A:
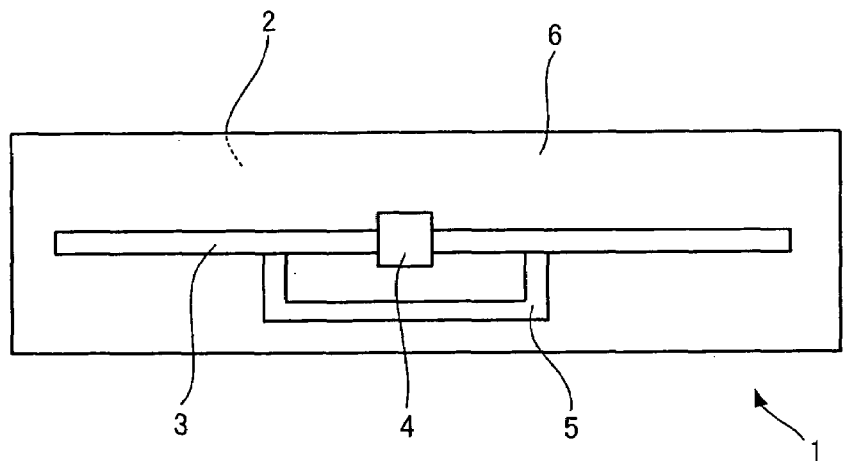
FIGS. 1(A) and 1(B) are a front view and a side view, respectively, of the first embodiment of the present invention.
Figure 1B:
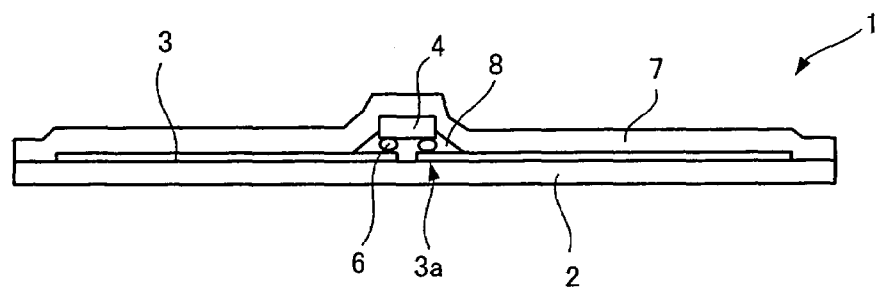

FIGS. 1(A) and 1(B) are a front view and a side view, respectively, of the first embodiment of the present invention. However, in the front view shown here, the internal structure is seen through from the front of an RFID tag and in the side view shown here, the internal structure is seen through from the side of an RFID tag.

An RFID tag 1 shown in FIGS. 1(A) and 1(B) is constituted by an antenna pattern 3 provided on a base sheet 2, a circuit chip 4 which is bonded onto the base sheet 2 with an epoxy adhesive 8 and is electrically connected to the antenna pattern via a bump 6, an inductance pattern 5 which is electrically connected to the antenna pattern 3 and generates an inductance, and a cover sheet 7 which covers these antenna pattern 3, circuit chip 4 and inductance pattern 5 and bonded to the base sheet 2. The cover sheet 7 is usually formed from a material selected from among PET materials, polyester materials, polyolefin materials, polycarbonate materials, acrylic materials, etc.

In this first embodiment, the above-described base sheet 2, circuit chip 4 and bump 6 correspond, respectively, to an example of the base, circuit chip and electric conductor according to the present invention. And a combination of the antenna pattern 3 and the inductance pattern 5 corresponds to an example of the antenna pattern according to the present invention, and inductance pattern 5 corresponds to an example of the inductance generation portion according to the present invention.

This RFID tag 1 receives the energy of an electromagnetic field released by a reader/writer as electric energy by use of the antenna pattern 3 and the circuit chip 4 is driven by the electric energy, whereby the communication action is realized.

This RFID tag 1 is made by performing the following procedure. First, the bump 6 is attached to the circuit chip 4. The end portion of the antenna pattern 3 on the circuit chip 4 side provides a pad 3a to electrically connect this antenna pattern 3 to other parts. The circuit chip 4 to which the bump 6 is attached is pressed against the base sheet 2 to ensure that the bump 6 is attached to the pad 3a and at the same time, the circuit chip 4 is fixed with an adhesive 8 and heated.

The end portion of the antenna pattern 3 on the circuit chip 4 side provides the pad 3a to electrically connect this antenna pattern 3 to the circuit chip 4 via the bump 6, and this pad 3a and the circuit chip 4 partially overlap each other in such a manner as to pinch the bump 6 between the two, with a gap for the bump 6. In the portion where the two overlap each other (the overlapping portion), the adhesive 8 is filled in the area except the bump 6, with the result that a capacitor which is unnecessary in terms of design is formed in the above-described overlapping portion, with the pad 3a and the circuit chip 4 serving as electrodes. The capacity of this capacitor (the parasitic capacity) prevents the input of power from the antenna pattern 3 to the circuit chip 4, causing troubles such as the deterioration of the communication distance of the RFID tag 1. Therefore, the present embodiment is constituted in such a manner that by causing a resonance to occur between the inductance generated by the inductance pattern 5 provided on the antenna pattern 3 side and the above-described parasitic capacity, this parasitic capacity is canceled out.

In the present embodiment, the inductance is found using Eq. (1) below on the basis of a parasitic capacity (standard capacity) which is considered to be generated in the overlapping portion of the circuit chip 4 and the pad 3a on the assumption that the circuit chip 4 is mounted in a standard position determined in performing designing. In Eq. (1), "L" is an inductance, "C" is the standard capacity, and "f" is resonance frequency.

$$(2\pi f)^2 = 1/(L \times C) \quad (1)$$

On the assumption that the circuit chip 4 is mounted in the standard position, the standard capacity C is found using Eq. (2) below, where the area of the overlapping portion of the circuit chip 4 and of the pad 3a (the standard area) is denoted by "S," the gap between the circuit chip 4 and the pad 3a (the standard gap) is denoted by "D," and the dielectric constant of the adhesive 8 is denoted by "$\epsilon$."

$$C = \epsilon \times S/D \quad (2)$$

Variations ascribed to the accuracy of manufacture etc. exist in the mounting position of the circuit chip 4, and hence it follows that the area of an actual overlapping portion of the circuit chip 4 and of the pad 3a has some error with respect to the above-described standard area S. If the area of an actual overlapping portion differs from the standard area S, also a parasitic capacity which actually occurs in an RFID tag 1 differs from the standard capacity C. Therefore, even when the inductance pattern 5 which generates an inductance L is found on the basis of the standard capacity C, it becomes impossible to ensure the matching given by Eq. (1) between an actual parasitic capacity and the inductance L and hence there is a possibility that the parasitic capacity may not be canceled out. In the present embodiment, therefore, even when variations occur in the mounting position of the circuit chip 4, in order to ensure that an actual parasitic capacity is substantially equally to the standard capacity C, that is, the parasitic capacity is stabilized at the standard capacity C for manufacturing reasons, the shape of the pad 3a of the antenna pattern 3 is contrived as described below.

Figure 2:
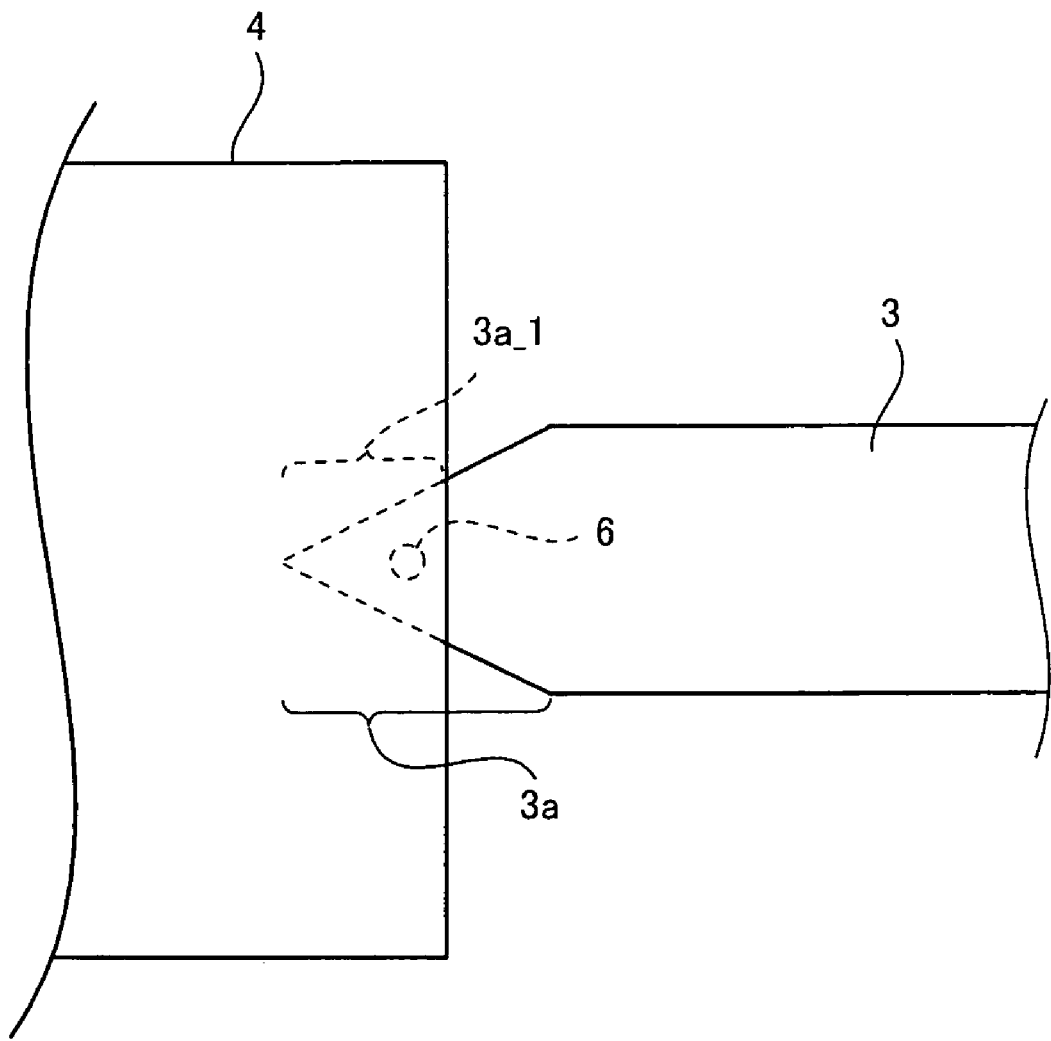
FIG. 2 is an enlarged view which shows the shape of a pad of the antenna pattern of FIG. 1.

FIG. 2 is an enlarged view which shows the shape of a pad of the antenna pattern of FIG. 1.

In FIG. 2 is shown an enlarged view of the area near the pad 3a of the antenna pattern 3 in the RFID tag 1 in the present embodiment. As shown in FIG. 2, that the pad 3a has the shape of a triangle the leading end of which faces the circuit chip 4. Part 3a-1 of this pad 3a overlaps the circuit chip 4. The above-described parasitic capacity is generated in this overlapping portion. This triangular shape of the pad 3a corresponds to an example of the "tapered shape" according to the present invention.

Even in a case where variations occur in the mounting position of the circuit chip 4, the triangular pad 3a shown in FIG. 2 is provided as a contrivance to stabilize the parasitic capacity at the standard capacity C, and the effect obtained from this pad 3a will be described below.

Figure 3B:
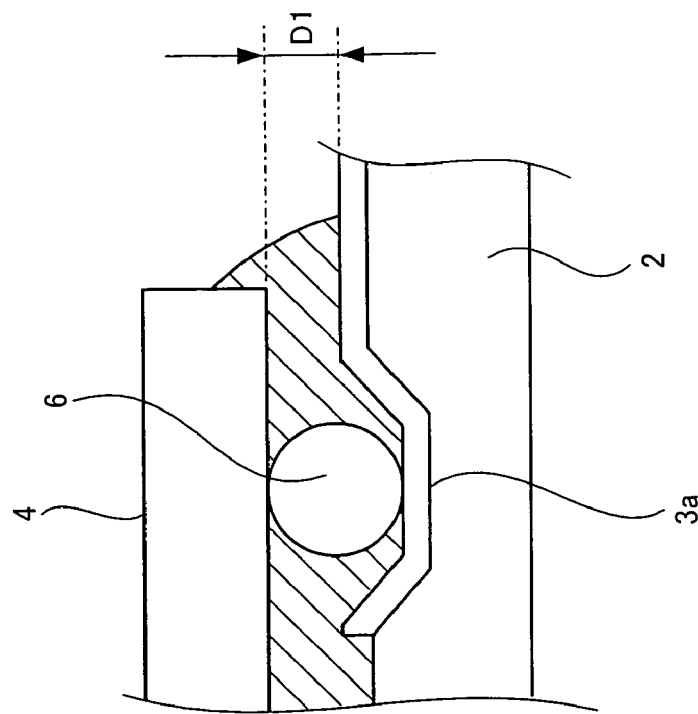
FIGS. 3(A) and 3(B) are an enlarged front view and an enlarged side view, respectively, of the area near a pad in a case where a circuit chip is mounted in such a manner as to be shifted toward the leading end side of the triangular pad from a standard position.
Figure 3A:
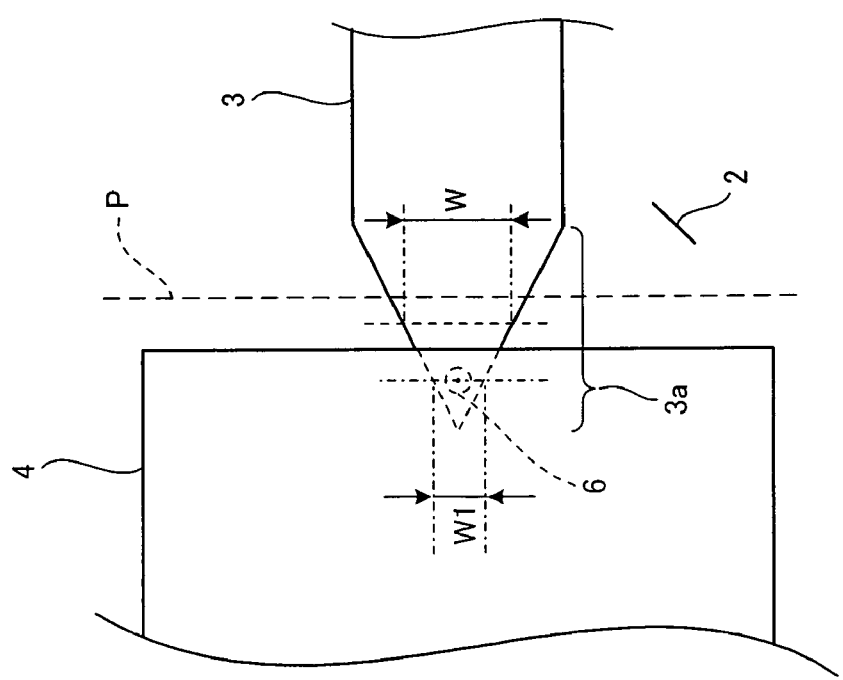

FIGS. 3(A) and 3(B) are an enlarged front view and an enlarged side view, respectively, of the area near a pad in a case where a circuit chip is mounted in such a manner as to be shifted toward the leading end side of the triangular pad from a standard position. In this enlarged side view, the internal structure near the pad in an RFID tag 1 is seen through from the side. In the present specification, all drawings called enlarged side views are similar ones.

In the case where a circuit chip 4 is mounted in such a manner as to be shifted toward the leading end side of the triangular pad 3a from a standard position P, as shown in the enlarged front view of FIG. 3(A), the area of an overlapping portion of the circuit chip 4 and of the pad 3a is narrower than the area of an overlapping portion in a case where the circuit chip 4 is disposed in the standard position P, i.e., the above-described standard area S.

As described above, the circuit chip 4 is pressed against a base sheet 2, with a bump 6 pinched between the two. As a result, the bump 6 receives a depressing force from the circuit chip 4, and as shown in the enlarged side view of FIG. 3(B), the bump 6, along with part of the pad 3a, sinks into the base sheet 2.

Also, the bump 6 is first attached to the circuit chip 4. For this reason, when the circuit chip 4 is mounted in such a manner as to be shifted toward the leading end side of the triangular pad 3a from a standard position P, as in the example of FIGS. 3(A) and 3(B), the bump 6 is attached to the part near the leading end on the pad 3a compared to the case where the circuit chip 4 is disposed in the standard position P. Because at this time the pad 3a is in the shape of a triangle, the width W1 of the pad 3a in a part where the bump is disposed, becomes narrower than the width W of the pad 3a in a part where the bump is disposed when the circuit chip 4 is disposed in the standard position P. As a result of this, the strength of the part of the pad 3a which supports the bump 6 becomes weaker than the strength obtained when the circuit chip 4 is disposed in the standard position P, and the bump 6 sinks into the base sheet 2 deeper than in the case where the circuit chip 4 is disposed in the standard position P. As a result, the gap D1 between the circuit chip 4 and the pad 3a in the overlapping portion of the circuit chip 4 and of the pad 3a becomes narrower than the gap between the circuit chip 4 and the pad 3a when the circuit chip 4 is disposed in the standard position P, that is, the gap D.

When the circuit chip 4 is mounted in such a manner as to be shifted toward the leading end side of the triangular pad 3a from the standard position P, as in the example of FIGS. 3(A) and 3(B), as described above, the area of the overlapping portion becomes narrower than the standard area S. As is apparent from Eq. (2) above, the parasitic capacity of the overlapping portion is proportional to the area of the overlapping portion and, therefore, the above-described narrowing of the overlapping portion reduces the parasitic capacity to a level lower than the standard capacity C. On the other hand, as is apparent from Eq. (2), the parasitic capacity is inversely proportional to the gap between the circuit chip 4 and the pad 3a and, therefore, the shortening of the gap between the circuit chip 4 and the pad 3a increases the parasitic capacity to a level higher than the standard capacity C. Eventually, a decrease in the parasitic capacity due to the narrowing of the area of the overlapping portion is compensated for by an increase in the parasitic capacity due to the shortening of the gap between the circuit chip 4 and the pad 3a. That is, even when the circuit chip 4 is mounted in such a manner as to be shifted toward the leading end side of the triangular pad 3a from the standard position P, as in the example of FIGS. 3(A) and 3(B), the parasitic capacity in the overlapping portion becomes almost equal to the standard capacity C.

Next, a description will be given of a case where, contrary to the example of FIGS. 3(A) and 3(B), a circuit chip 4 is mounted in such a manner as to be shifted toward the base side of a triangular pad 3a.

Figure 4B:
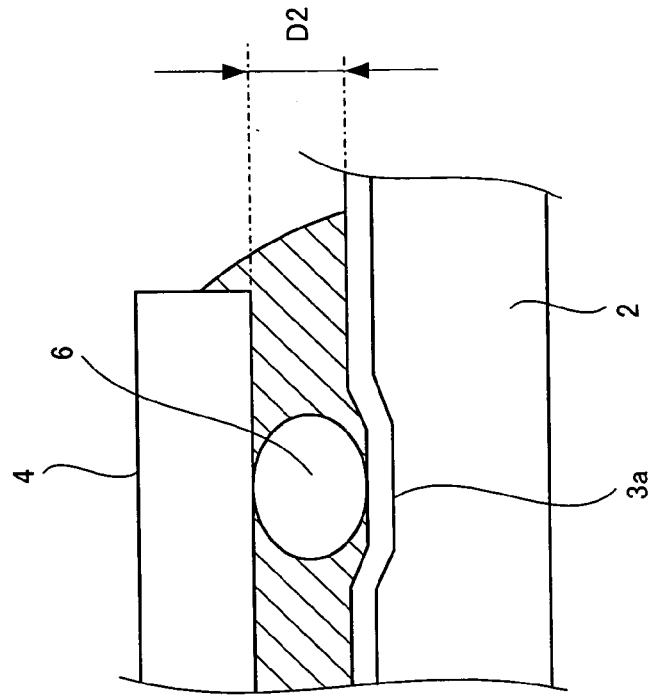
FIGS. 4(A) and 4(B) are an enlarged front view and an enlarged side view, respectively, of the area near a pad in a case where a circuit chip is mounted in such a manner as to be shifted toward the base side of the triangular pad from a standard position.
Figure 4A:
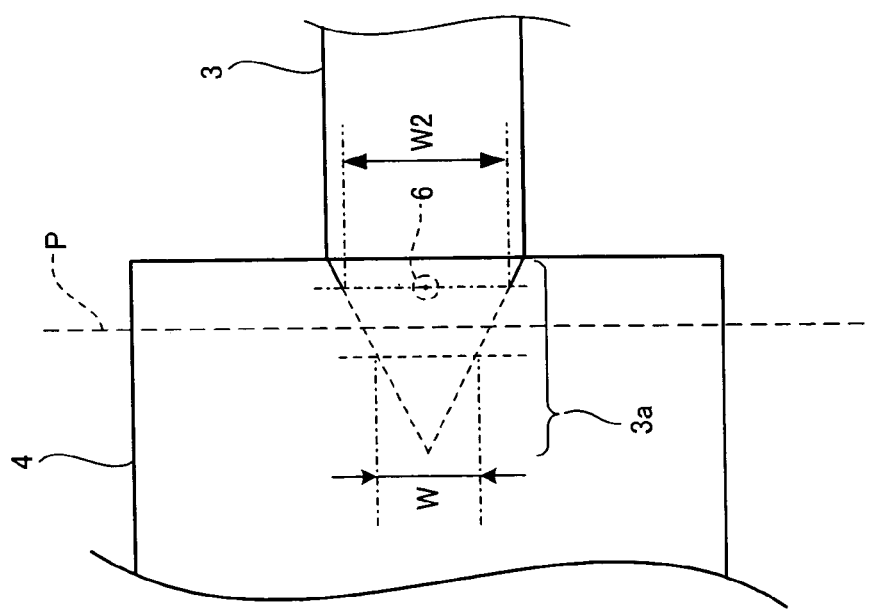

FIGS. 4(A) and 4(B) are an enlarged front view and an enlarged side view, respectively, of the area near a pad in a case where a circuit chip is mounted in such a manner as to be shifted toward the base side of the triangular pad from a standard position.

In the case of FIGS. 4(A) and 4(B), as shown in the enlarged front view of FIG. 4(A), the area of the overlapping portion of the circuit chip 4 and of the pad 3a becomes wider than the area of the overlapping portion when the circuit chip 4 is disposed in the standard position P, i.e., the above-described area standard area S. On the other hand, in this case, the width W2 of the part where the bump 6 is disposed, becomes wider than the width W of the part where the bump 6 is disposed when the circuit chip 4 is disposed in the standard position P. As a result of this, the strength of the part of the pad 3a which supports the bump 6 becomes stronger than the strength obtained when the circuit chip 4 is disposed in the standard position P, and the bump 6 sinks into the base sheet 2 less deep than in the case where the circuit chip 4 is disposed in the standard position P. As a result, the gap D2 between the circuit chip 4 and the pad 3a in the overlapping portion of the circuit chip 4 and of the pad 3a becomes wider than the above-described standard gap D. The widening of the area of the overlapping portion increases the parasitic capacity to a level higher than the standard capacity C, and the widening of the gap between the circuit chip 4 and the pad 3a reduces the parasitic capacity to a level lower than the standard capacity C. Eventually, an increase in the parasitic capacity due to the widening of the area of the overlapping portion is canceled out by a decrease in the parasitic capacity due to the widening of the gap between the circuit chip 4 and the pad 3a. That is, even when the circuit chip 4 is mounted in such a manner as to be shifted toward the base side of the triangular pad 3a from the standard position P, as in the example of FIGS. 4(A) and 4(B), the parasitic capacity becomes almost equal to the standard capacity C.

As described above by referring to FIGS. 3(A) and 3(B) and FIGS. 4(A) and 4(B), in an RFID tag 1 of the present embodiment, even when the mounting position of the circuit chip 4 is shifted from the above-described standard position P toward the lead end side or the base side of the triangular pad 3a, the parasitic capacity becomes almost equal to the standard capacity C. That is, in an RFID tag of the present embodiment, the parasitic capacity is stable at the standard capacity C for manufacturing reasons and, therefore, the inductance L found on the basis of the standard capacity C works effectively. In this manner, in an RFID tag 1 of the present embodiment, it is possible to find an effective inductance L in the design stage and hence during manufacturing, troublesome work such as the adjustment of inductance is unnecessary and it is necessary only that an inductance pattern as designed be made. Therefore, it is possible to manufacture an RFID tag 1 of the present embodiment with high productivity while avoiding the deterioration of communication distance ascribed to the parasitic capacity.

Incidentally, the "tapered shape" in the present invention is not limited to the triangular shape in the above-described first embodiment and may be shapes as described below.

In the following, two examples in which the shape of the pad is different from that of the first embodiment will be described as the second embodiment and the third embodiment. However, these embodiments differ from the first embodiment only in the shape of the pad, and hence in the following, descriptions will be made by paying attention to the differences from the first embodiment.

Figure 5:
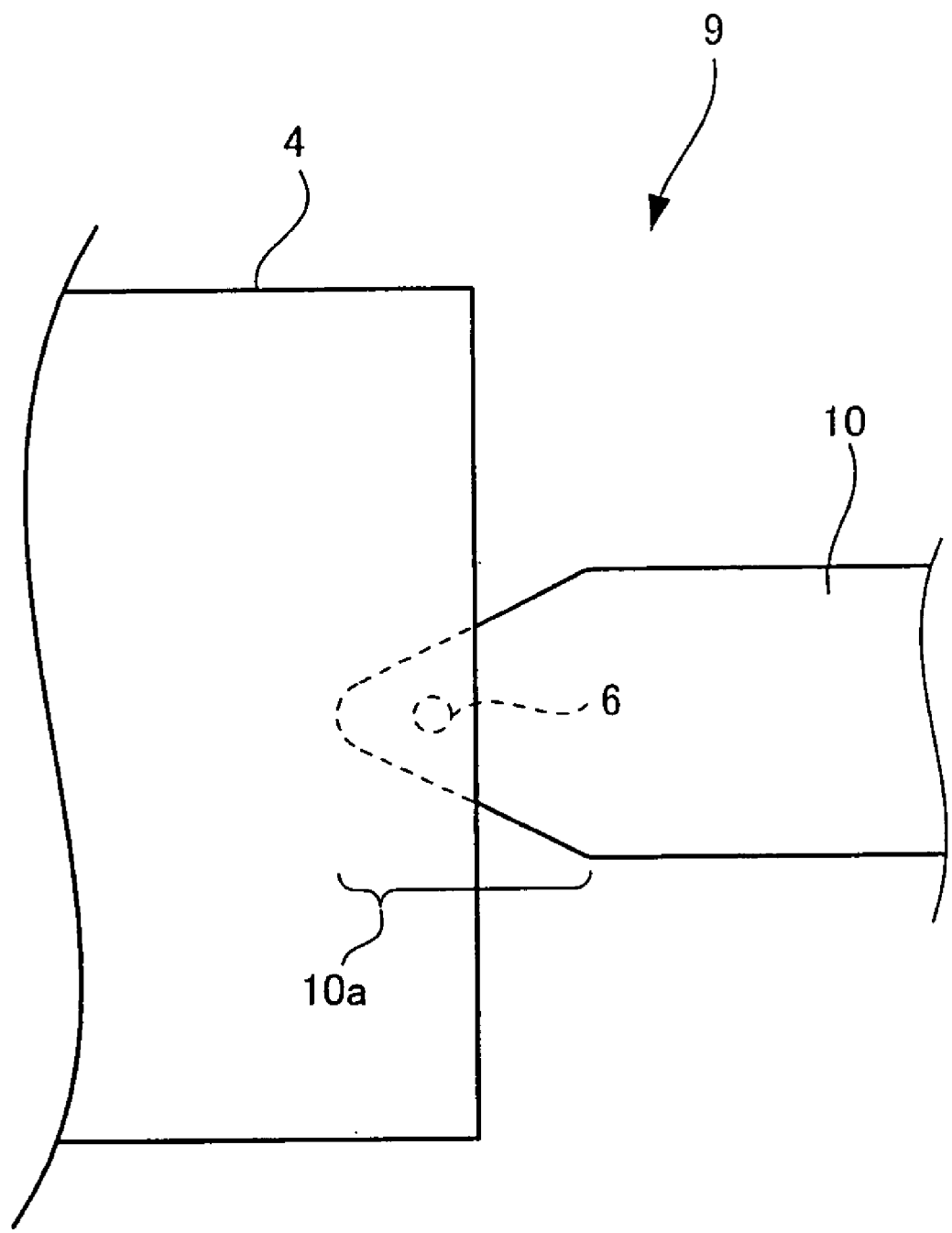
FIG. 5 is an enlarged view which shows the shape of an antenna pattern in an RFID tag of the second embodiment of the present invention.

FIG. 5 is an enlarged view which shows the shape of an antenna pattern in an RFID tag of the second embodiment of the present invention. Incidentally, in FIG. 5, like reference numerals refer to elements similar to the component elements of the above-described first embodiment.

In an RFID tag 9 shown in FIG. 5, a pad 10a of an antenna pattern 10 on which a bump 6 has a tapered shape with a rounded leading end. In the present embodiment, this shape of the pad 10a produces the same effect as the triangular shape of the pad 3a of the first embodiment, and variations in the parasitic capacity ascribed to variations in the mounting position of the circuit chip 4 are suppressed, with the result that this parasitic capacity becomes stable for manufacturing reasons.

Figure 6:
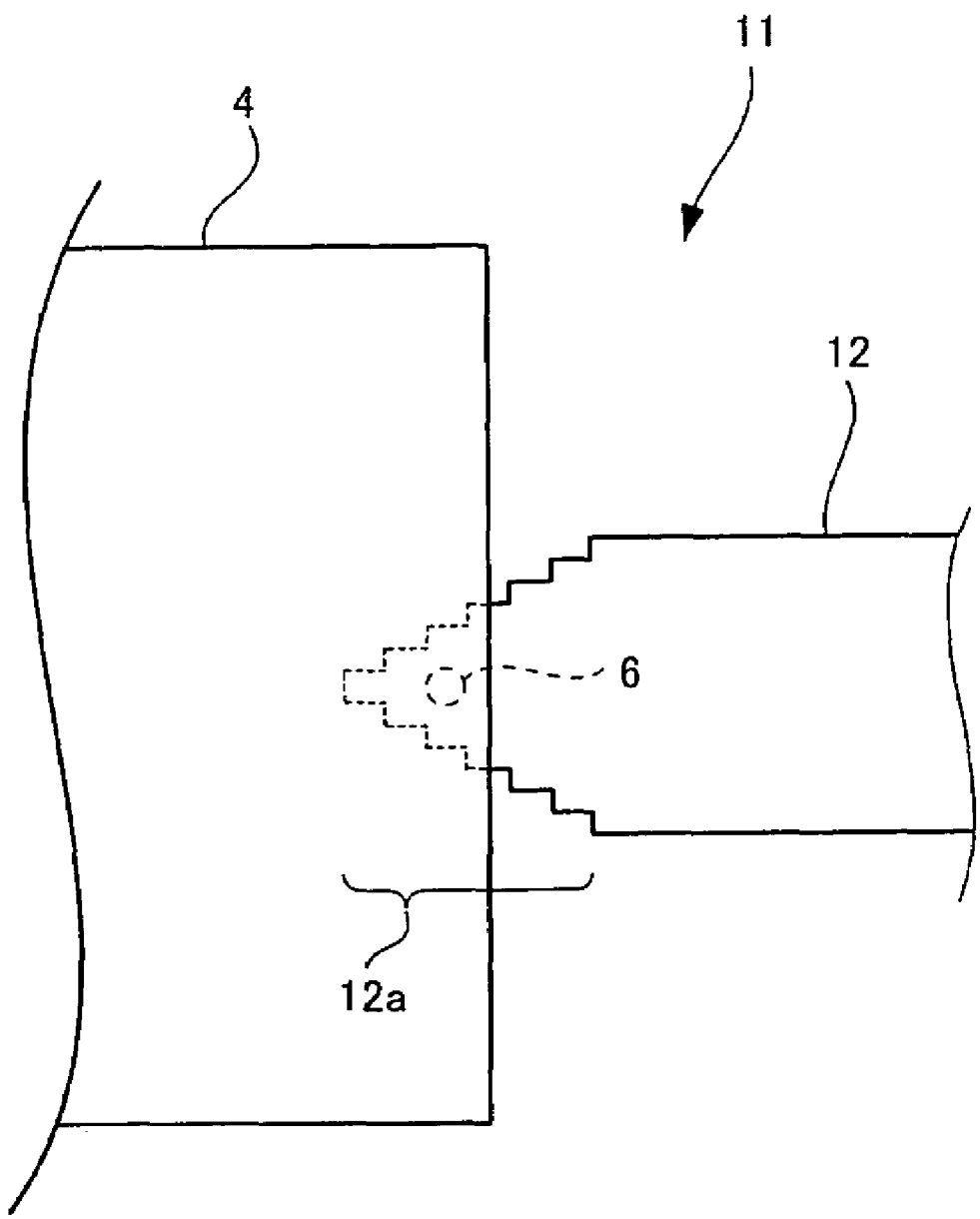
FIG. 6 is an enlarged view which shows the shape of an antenna pattern in an RFID tag of the third embodiment of the present invention.

FIG. 6 is an enlarged view which shows the shape of an antenna pattern in an RFID tag of the third embodiment of the present invention. Also in FIG. 6, like reference numerals refer to elements similar to the component elements of the above-described first embodiment.

In An RFID tag 11 shown in FIG. 6, a pad 12a of an antenna pattern 12 on which a bump 6 is mounted has a tapered shape the width of which becomes narrower by stages toward the circuit chip 4 side. In the present embodiment, this shape of the pad 12a produces the same effect as the triangular shape of the pad 3a of the first embodiment and the tapered shape of the pad 10a of the second embodiment with a rounded leading end and variations in the parasitic capacity ascribed to variations in the mounting position of the circuit chip 4 are suppressed, with the result that this parasitic capacity becomes stable for manufacturing reasons.

As described above, according to the RFID tags of the first to third embodiments, the parasitic capacity is stable regardless of variations in the mounting of the circuit chip, and hence an inductance effective for canceling out the parasitic capacity is found in the design stage. As a result of this, unnecessary troublesome work such as the adjustment of inductance during manufacturing can be saved and high-productivity manufacturing becomes possible. That is, it is possible to manufacture the RFID tags of the first to third embodiments with high productivity while avoiding the deterioration of communication distance ascribed to the parasitic capacity.

In the foregoing, as examples of the antenna pattern according to the present invention, the descriptions were given of three examples of the antenna pattern 3 having the triangular pad 3a, the antenna pattern 10 having the tapered pad 10a with a rounded leading end, and the antenna pattern 12 having the tapered pad 12a in which the width decreases by stages to ward the circuit chip side. However, the present invention is not limited to them. As an antenna pattern of the present invention, any antenna pattern having a pad which becomes narrow toward the leading end can be used regardless of the shape of the pad.

What is claimed is:

1. An RFID tag, comprising:
    a base;
    an antenna pattern that is provided on the base to form a communication antenna and has a connection end portion which has a shape that narrows in width toward an end and provides a connection terminal to the antenna;
    an electric conductor that is attached onto the connection end portion of the antenna pattern and is smaller than the connection end portion; and
    a circuit chip that is electrically connected to the antenna pattern via the electric conductor and performs radio communication by use of the antenna;

wherein at least a tip of the connection end portion is provided under the circuit chip; and the electric conductor is sandwiched between the connection end portion and the circuit chip.

2. The RFID tag according to claim 1, wherein the antenna pattern has an inductance generation portion that generates an inductance suited to a capacitance between the connection end portion and the circuit chip and prevents performance deterioration of the antenna due to the capacitance.

3. The RFID tag according to claim 1, wherein the shape that narrows in width is tapered.

4. The RFID tag according to claim 1, wherein the shape that narrows in width is triangular.

5. The RFID tag according to claim 1, wherein the shape that narrows in width is tapered with a rounded end.

6. The RFID tag according to claim 1, wherein the shape that narrows in width is a shape that narrows by stages.

7. The RFID tag according to claim 1, wherein a parasitic capacity, which occurs in an overlapping portion where the circuit chip and the connection end portion of the antenna pattern overlap each other is proportional to the area of the overlapping portion end inversely proportional to a gap between the circuit chip and the connection end portion of the antenna pattern.

8. An RFID tag, comprising:

an antenna portion; and a circuit chip coupled to the antenna portion by a conductor sandwiched between the antenna portion and the circuit chip;

wherein a surface area of the antenna portion in an overlapping portion of the antenna portion and circuit chip decreases in a direction of the circuit chip.

9. The RFID tag according to claim 8, wherein a gap between the antenna portion and the circuit chip is proportional to the overlapping portion.

10. An RFID tag, comprising:

an antenna portion; and a circuit chip coupled to the antenna portion by a conductor sandwiched between the antenna portion and the circuit chip;

wherein a width of the antenna portion in an overlapping portion of the antenna portion and circuit chip is smaller than a width of the antenna portion outside the overlapping portion.

* * * * *

UNITED STATES PATENT AND TRADEMARK OFFICE
CERTIFICATE OF CORRECTION

| | | |
|---|---|---|
| PATENT NO. | : 7,298,273 B2 | Page 1 of 1 |
| APPLICATION NO. | : 11/142356 | |
| DATED | : November 20, 2007 | |
| INVENTOR(S) | : Shunji Baba | |

It is certified that error appears in the above-identified patent and that said Letters Patent is hereby corrected as shown below:

In the claims

Column 9, line 22, after "other" insert --,--

Column 9, line 23, delete "end", insert --and--

Signed and Sealed this

Sixth Day of May, 2008

JON W. DUDAS
*Director of the United States Patent and Trademark Office*